US011190209B2

(12) United States Patent
Blaum et al.

(10) Patent No.: US 11,190,209 B2
(45) Date of Patent: Nov. 30, 2021

(54) EXPANSION FOR BLAUM-ROTH CODES

(71) Applicant: International Business Machines Corporation, Armonk, NY (US)

(72) Inventors: Mario Blaum, San Jose, CA (US); Steven R. Hetzler, Los Altos, CA (US); Veera W. Deenadhayalan, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 88 days.

(21) Appl. No.: 16/262,599

(22) Filed: Jan. 30, 2019

(65) Prior Publication Data
US 2020/0244284 A1 Jul. 30, 2020

(51) Int. Cl.
| | |
|---|---|
| *H03M 13/00* | (2006.01) |
| *H03M 13/11* | (2006.01) |
| *H03M 13/15* | (2006.01) |
| *G06F 11/10* | (2006.01) |

(52) U.S. Cl.
CPC ......... *H03M 13/11* (2013.01); *H03M 13/616* (2013.01); *G06F 11/10* (2013.01); *G06F 11/1076* (2013.01); *H03M 13/159* (2013.01); *H03M 13/1575* (2013.01)

(58) Field of Classification Search
CPC ............... H03M 13/11; H03M 13/616; H03M 13/1575; H03M 13/159; G06F 11/10; G06F 11/1076
USPC ........................................ 714/752, 758, 776
See application file for complete search history.

(56) References Cited

U.S. PATENT DOCUMENTS

| | | | | |
|---|---|---|---|---|
| 5,121,498 A | * | 6/1992 | Gilbert .................... | G06F 8/452 717/141 |
| 5,299,208 A | * | 3/1994 | Blaum .................... | G06F 11/10 714/761 |
| 5,351,246 A | * | 9/1994 | Blaum ................ | G06F 11/1092 714/6.21 |
| 5,579,475 A | * | 11/1996 | Blaum ................ | G06F 11/1076 714/6.32 |
| 5,644,695 A | * | 7/1997 | Blaum ................ | G06F 11/1076 714/6.12 |

(Continued)

OTHER PUBLICATIONS

Tamo et al., "Optimal Locally Repairable Codes and Connections to Matroid Theory," IEEE Transactions on Information Theory, vol. 62, No. 12, Dec. 2016, pp. 6661-6671.

(Continued)

*Primary Examiner* — Esaw T Abraham
*Assistant Examiner* — Osman M Alshack
(74) *Attorney, Agent, or Firm* — Zilka-Kotab, P.C.

(57) ABSTRACT

A computer-implemented method includes encoding an array of $(p-1) \times k$ symbols of data into a $p \times (k+r)$ array. The method includes p is a prime number, $r \geq 1$, and $k \leq p-r$. The method also includes each column in the $p \times (k+r)$ array has an even parity and each line of slope j for $0 \leq j \leq r-1$ in the $p \times (k+r)$ array has an even parity. The method includes the lines of slope j taken with a toroidal topology modulo p. A computer program product for encoding an array of $(p-1) \times k$ symbols of data into a $p \times (k+r)$ array includes a computer readable storage medium having program instructions executable by a computer. The program instructions cause the computer to perform the foregoing method.

20 Claims, 11 Drawing Sheets

(56) References Cited

U.S. PATENT DOCUMENTS

| | | | |
|---|---|---|---|
| 6,062,481 A * | 5/2000 | Storch | G06F 11/14 235/494 |
| 7,321,905 B2 | 1/2008 | Hartline et al. | |
| 7,870,464 B2 * | 1/2011 | Hafner | G06F 11/1076 714/770 |
| 8,433,979 B2 | 4/2013 | Blaum et al. | |
| 8,595,606 B1 * | 11/2013 | Feng | H03M 13/2909 714/800 |
| 9,252,815 B2 | 2/2016 | Blaum et al. | |
| 9,454,333 B2 | 9/2016 | Blaum et al. | |
| 9,870,284 B2 | 1/2018 | Blaum et al. | |
| 10,031,701 B2 | 7/2018 | Best et al. | |
| 2002/0147954 A1 * | 10/2002 | Shea | H03M 13/098 714/755 |
| 2006/0074995 A1 | 4/2006 | Hafner et al. | |
| 2006/0129873 A1 | 6/2006 | Hafner | |
| 2008/0244370 A1 * | 10/2008 | Lam | G11C 11/5621 714/803 |
| 2013/0205181 A1 * | 8/2013 | Blaum | H03M 13/033 714/763 |
| 2016/0380650 A1 | 12/2016 | Calder et al. | |
| 2017/0228283 A1 * | 8/2017 | Best | G06F 3/0689 |

OTHER PUBLICATIONS

Blaum et al., "Extended Product and Integrated Interleaved Codes," IEEE Transactions on Information Theory, vol. 64, No. 3, Mar. 2018, pp. 1497-1513.

Blaum et al., "New Array Codes for Multiple Phased Burst Correction," Transactions on Information Theory, vol. 39, No. 1, Jan. 1993, pp. 66-77.

Guo et al., "On Systematic Encoding for Blaum-Roth Codes," IEEE International Symposium on Information Theory Proceedings, 2011, pp. 2353-2357.

Wikipedia, "Parity bit," Wikipedia, 2018, 5 pages, retrieved from https://en.wikipedia.org/wiki/Parity_bit.

Blaum et al., "EVENODD: An Efficient Scheme for Tolerating Double Disk Failures in RAID Architectures," IEEE Transactions on Computers, vol. 44, No. 2, Feb. 1995, pp. 192-202.

Blaum et al., "The EVENODD Code and its Generalization: An Effcient Scheme for Tolerating Multiple Disk Failures in RAID Architectures," High Performance Mass Storage and Parallel I/O: Technologies and Applications, Chapter 8, 2002, pp. 93-117.

Hou et al., "BASIC Codes: Low-Complexity Regenerating Codes for Distributed Storage Systems," IEEE Transactions on Information Theory, vol. 62, No. 6, Jun. 2016, pp. 3053-3069.

Tamo et al., "Bounds on Locally Recoverable Codes with Multiple Recovering Sets," IEEE International Symposium on Information Theory, 2014, pp. 691-695.

Gopalan et al., "Explicit Maximally Recoverable Codes With Locality," IEEE Transactions on Information Theory, vol. 60, No. 9, Sep. 2014, pp. 5245-5256.

Blaum, M., "A Family of MDS Array Codes with Minimal Number of Encoding Operations," IEEE International Symposium on Information Theory, Jul. 2006, pp. 2784-2788.

Gopalan et al., "On the Locality of Codeword Symbols," IEEE Transactions on Information Theory, vol. 58, No. 11, Nov. 2012, pp. 6925-6934.

Gopalan et al., "Maximally Recoverable Codes for Grid-like Topologies," arXiv print, 2016, 23 pages, retrieved from https://arxiv.org/abs/1605.05412v1.

Tamo et al., "A Family of Optimal Locally Recoverable Codes," IEEE Transactions on Information Theory, vol. 60, No. 8, Aug. 2014, pp. 4661-4676.

Corbett et al., "Row-Diagonal Parity for Double Disk Failure Correction," Proceedings of the Third USENIX Conference on File and Storage Technologies, 2004, 15 pages.

Shum et al., "Regenerating Codes over a Binary Cyclic Code," IEEE International Symposium on Information Theory, 2014, pp. 1046-1050.

Hou et al., "A Unified Form of EVENODD and RDP Codes and Their Efficient Decoding," arXiv Draft, IEEE Transactions on Communications, Mar. 2018, pp. 1-30.

Zeh et al., "Bounds and Constructions of Codes with Multiple Localities," IEEE International Symposium on Information Theory, 2016, pp. 640-644.

* cited by examiner

| Col. # | 0 | 1 | 2 | 3 | 4 |
|---|---|---|---|---|---|
| | 0 | E | 0 | 0 | E |
| | E | 0 | 0 | E | 0 |
| | 0 | 0 | E | 0 | E |
| | 0 | E | 0 | E | 0 |
| | E | 0 | E | 0 | 0 |

FIG. 8

| Col. # | 0 | 1 | 2 | 3 | 4 |
|---|---|---|---|---|---|
| | 0 | 0 | 0 | 0 | 0 |
| | 0 | 0 | 0 | 0 | 0 |
| | 0 | 0 | 0 | 0 | 0 |
| | 0 | 0 | 0 | 0 | 0 |
| | 0 | 0 | 0 | 0 | 0 |

| Col. # | 0 | 1 | 2 | 3 | 4 |
|---|---|---|---|---|---|
| | 0 | 1 | 0 | 0 | 1 |
| | 1 | 0 | 0 | 1 | 0 |
| | 0 | 0 | 1 | 0 | 1 |
| | 0 | 1 | 0 | 1 | 0 |
| | 1 | 0 | 1 | 0 | 0 |

| Col. # | 0 | 1 | 2 | 3 | 4 |
|---|---|---|---|---|---|
| 4 | E | E | E | E | E |
| 3 | E | E | E | E | E |
| 2 | 0 | 1 | 1 | 1 | 1 |
| 1 | E | E | E | E | E |
| 0 | 1 | 1 | 0 | 0 | 0 |

FIG. 12

| Col. # | 0 | 1 | 2 | 3 | 4 |
|---|---|---|---|---|---|
| 4 | 0 | 1 | 0 | 0 | 1 |
| 3 | 1 | 0 | 0 | 0 | 1 |
| 2 | 0 | 1 | 1 | 1 | 1 |
| 1 | 0 | 1 | 1 | 1 | 1 |
| 0 | 1 | 1 | 0 | 0 | 0 |

FIG. 10

| Col. # | 0 | 1 | 2 | 3 | 4 |
|---|---|---|---|---|---|
| 4 | E | E | E | E | E |
| 3 | E | E | E | E | E |
| 2 | 0 | 1 | 1 | E | 1 |
| 1 | E | E | E | E | E |
| 0 | E | 1 | 0 | 0 | 0 |

| 0 | 1 | 1 | 1 | 1 | 0 | 0 |
|---|---|---|---|---|---|---|
| 1 | 0 | 0 | 1 | 0 | 0 | 0 |
| 0 | 1 | 0 | 1 | 0 | 0 | 0 |
| 1 | 1 | 1 | 1 | 0 | 0 | 0 |
| 1 | 0 | 1 | 0 | 0 | 0 | 0 |
| 0 | 1 | 0 | 1 | 0 | 0 | 0 |
| 1 | 0 | 1 | 1 | 1 | 0 | 0 |

FIG. 16

| p | k | Encoding algorithm for $EBR(p,k,2)$ $\frac{3p(2k+1)-4k-5}{2}$ | Enhanced encoding algorithm for $EBR(p,k,2)$ $(3p-1)k-2$ | Improvement % |
|---|---|---|---|---|
| 17 | 8 | 415 | 398 | 4.1% |
| 17 | 15 | 758 | 748 | 1.3% |
| 127 | 8 | 3220 | 3038 | 5.7% |
| 127 | 50 | 19138 | 18998 | .7% |
| 127 | 125 | 47563 | 47498 | .1% |
| 257 | 8 | 6535 | 6158 | 5.8% |
| 257 | 50 | 38833 | 38498 | .9% |
| 257 | 255 | 196478 | 196348 | .07% |

EXPANSION FOR BLAUM-ROTH CODES

BACKGROUND

The present invention relates to locally recoverable codes, and more specifically, this invention relates to an expansion for Blaum-Roth codes.

Reliable delivery of data is an essential aspect of data storage systems. Error detection and correction schemes are used to detect errors in data delivery and reconstruct data when an error is detected. Error detection and correction schemes are especially important for delivery of data over unreliable communication channels and/or channels which are subject to noise. Data redundancy schemes, such as parity computation, enable reliable delivery of data using error detection and correction techniques by adding redundancy and/or extra data to a message. Redundancy and/or extra data may be used to check the message for consistency with the original message.

Classic Blaum-Roth (BR) codes with r parity columns include $(p-1) \times k$ (binary) arrays, where p is a prime number and $k \leq p$. Each line of slope i, $0 \leq i \leq r-1$, has even parity when the lines are taken toroidally. BR codes are a family of array codes over GF(q) for correcting multiple phased burst errors and erasures. Each phased burst may correspond to an erroneous and/or erased column in a code array. An array is said to be erroneous if at least one of the bits in a column is inverted. If the index of an erroneous column is known, the column is subject to an erasure.

BR codes are characterized geometrically by parity constraints along certain diagonal lines in each code array. BR codes have an efficient decoding algorithm which avoids multiplications and/or divisions over extension fields. BR codes replace these operations with cyclic shifts of vectors over GF(q).

SUMMARY

A computer-implemented method, according to one embodiment, includes encoding an array of $(p-1) \times k$ symbols of data into a $p \times (k+r)$ array. The method includes p is a prime number, $r \geq 1$, and $k \leq p-r$. The method also includes each column in the $p \times (k+r)$ array has an even parity and each line of slope j for $0 \leq j \leq r-1$ in the $p \times (k+r)$ array has an even parity. The method includes the lines of slope j taken with a toroidal topology modulo p.

A computer program product for encoding an array of $(p-1) \times k$ symbols of data into a $p \times (k+r)$ array, according to one embodiment, includes a computer readable storage medium having program instructions. The program instructions are executable by a computer. The program instructions cause the computer to perform the foregoing method.

Other aspects and embodiments of the present invention will become apparent from the following detailed description, which, when taken in conjunction with the drawings, illustrate by way of example the principles of the invention.

BRIEF DESCRIPTION OF THE DRAWINGS

FIG. 4 is an exemplary array for p=k=5 and r=3, according to one embodiment.

FIG. 5 an exemplary 4×5 array in a BR code, according to one embodiment.

FIG. 6 is an exemplary EBR(5, 3) where lines of slope 0, 1, 2, and slope ∞ have even parity, according to one embodiment.

FIG. 7 is an exemplary element in EBR(5, 3) wherein each column has even parity according to one embodiment.

FIG. 8 is an exemplary BR code with an additional parity row to form a 5×5 0-array where E corresponds to an erasure, according to one embodiment.

FIG. 9 illustrates two possible solutions for the erasures of FIG. 8 using a classic BR code with an additional parity row, according to one embodiment.

FIG. 10 is an illustrative decoding procedure for an EBR(5, 3) where E denotes an erasure, according to one embodiment.

FIG. 11 is the result of using the even parity in columns 0 and 2 to obtain the erased elements of FIG. 10, according to one embodiment.

FIG. 12 is the final decoded array of FIG. 10 using the disclosed method according to one embodiment.

FIG. 13 is an exemplary 6×2 array for encoding into 7×5 array, according to one embodiment.

FIG. 14 illustrates the output of performing the initial operation of the encoding, according to one embodiment.

FIG. 15 illustrates the output of performing the padding operation, according to one embodiment.

FIG. 16 is the final decoded array of FIG. 15, according to one embodiment.

FIG. 19 is an exemplary EBR(5, 2) code where E denotes an erasure, according to one embodiment.

FIG. 20 is the result of recovering the erasures in diagonals 1 and 4 of FIG. 19, according to one embodiment.

FIG. 21 is the result of recovering the erasures in columns 1 and 2 of FIG. 19, according to one embodiment.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The following description discloses several preferred embodiments of systems, methods and computer program products for expanding Blaum-Roth codes.

In one general embodiment, a computer-implemented method includes encoding an array of $(p-1)\times k$ symbols of data into a $p\times(k+r)$ array. The method includes p is a prime number, $r\geq 1$, and $k\leq p-r$. The method also includes each column in the $p\times(k+r)$ array has an even parity and each line of slope j for $0\leq j\leq r-1$ in the $p\times(k+r)$ array has an even parity. The method includes the lines of slope j taken with a toroidal topology modulo p.

A computer program product for encoding an array of $(p-1)\times k$ symbols of data into a $p\times(k+r)$ array, according to one embodiment, includes a computer readable storage medium having program instructions. The program instructions are executable by a computer. The program instructions cause the computer to perform the foregoing method.

Figure 1:
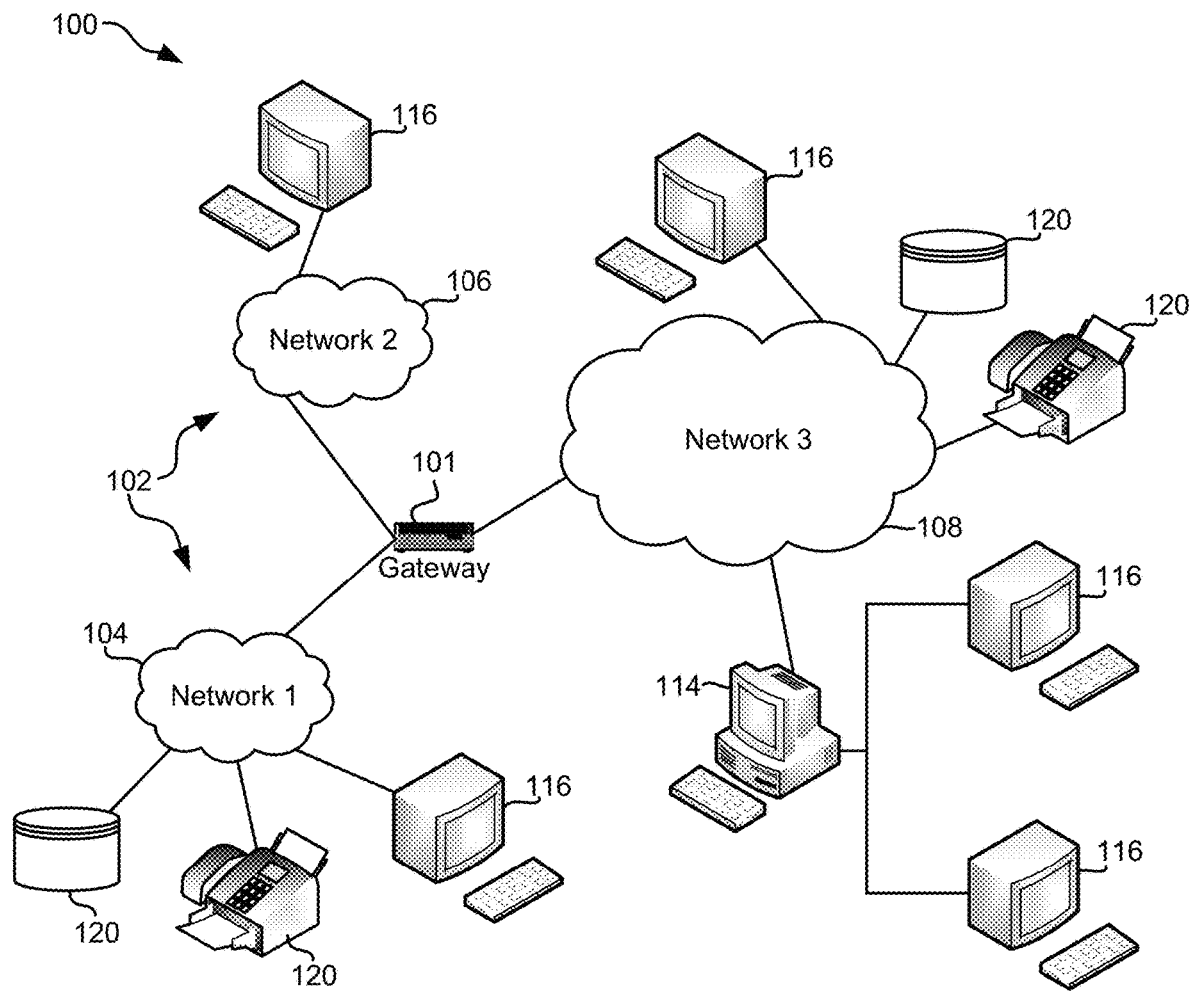
FIG. 1 illustrates a network architecture, in accordance with one embodiment.

FIG. 1 illustrates an architecture 100, in accordance with one embodiment. As shown in FIG. 1, a plurality of remote networks 102 are provided including a first remote network 104 and a second remote network 106. A gateway 101 may be coupled between the remote networks 102 and a proximate network 108. In the context of the present architecture 100, the networks 104, 106 may each take any form including, but not limited to a local area network (LAN), a wide area network (WAN) such as the Internet, public switched telephone network (PSTN), internal telephone network, etc.

In use, the gateway 101 serves as an entrance point from the remote networks 102 to the proximate network 108. As such, the gateway 101 may function as a router, which is capable of directing a given packet of data that arrives at the gateway 101, and a switch, which furnishes the actual path in and out of the gateway 101 for a given packet.

Further included is at least one data server 114 coupled to the proximate network 108, and which is accessible from the remote networks 102 via the gateway 101. It should be noted that the data server(s) 114 may include any type of computing device/groupware. Coupled to each data server 114 is a plurality of user devices 116. User devices 116 may also be connected directly through one of the networks 104, 106, 108. Such user devices 116 may include a desktop computer, lap-top computer, hand-held computer, printer or any other type of logic. It should be noted that a user device 116 may also be directly coupled to any of the networks, in one embodiment.

A peripheral 120 or series of peripherals 120, e.g., facsimile machines, printers, networked and/or local storage units or systems, etc., may be coupled to one or more of the networks 104, 106, 108. It should be noted that databases and/or additional components may be utilized with, or integrated into, any type of network element coupled to the networks 104, 106, 108. In the context of the present description, a network element may refer to any component of a network.

According to some approaches, methods and systems described herein may be implemented with and/or on virtual systems and/or systems which emulate one or more other systems, such as a UNIX system which emulates an IBM z/OS environment, a UNIX system which virtually hosts a MICROSOFT WINDOWS environment, a MICROSOFT WINDOWS system which emulates an IBM z/OS environment, etc. This virtualization and/or emulation may be enhanced through the use of VMWARE software, in some embodiments.

In more approaches, one or more networks 104, 106, 108, may represent a cluster of systems commonly referred to as a "cloud." In cloud computing, shared resources, such as processing power, peripherals, software, data, servers, etc., are provided to any system in the cloud in an on-demand relationship, thereby allowing access and distribution of services across many computing systems. Cloud computing typically involves an Internet connection between the systems operating in the cloud, but other techniques of connecting the systems may also be used.

Figure 2:
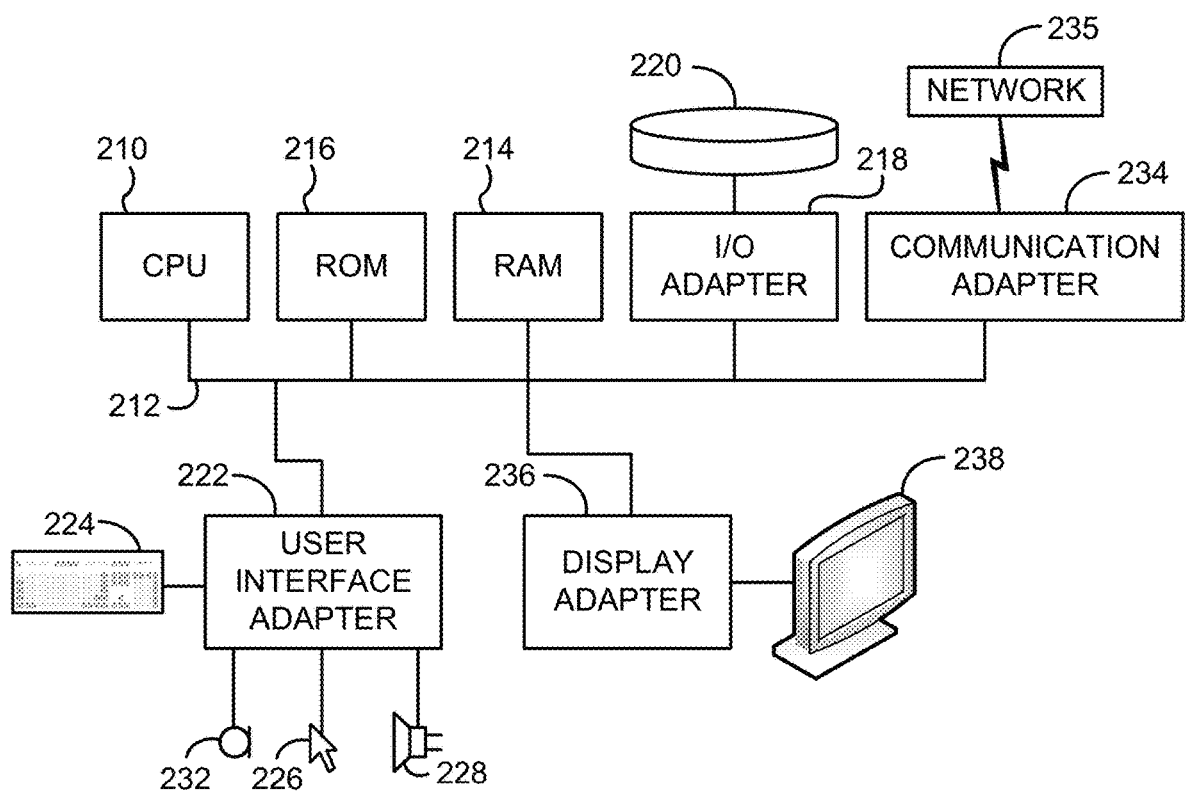
FIG. 2 shows a representative hardware environment that may be associated with the servers and/or clients of FIG. 1, in accordance with one embodiment.

FIG. 2 shows a representative hardware environment associated with a user device 116 and/or server 114 of FIG. 1, in accordance with one embodiment. Such figure illustrates a typical hardware configuration of a workstation having a central processing unit 210, such as a microprocessor, and a number of other units interconnected via a system bus 212.

The workstation shown in FIG. 2 includes a Random Access Memory (RAM) 214, Read Only Memory (ROM) 216, an input/output (I/O) adapter 218 for connecting peripheral devices such as disk storage units 220 to the bus 212, a user interface adapter 222 for connecting a keyboard 224, a mouse 226, a speaker 228, a microphone 232, and/or other user interface devices such as a touch screen and a digital camera (not shown) to the bus 212, communication adapter 234 for connecting the workstation to a communication network 235 (e.g., a data processing network) and a display adapter 236 for connecting the bus 212 to a display device 238.

The workstation may have resident thereon an operating system such as the Microsoft Windows® Operating System (OS), a MAC OS, a UNIX OS, etc. It will be appreciated that a preferred embodiment may also be implemented on platforms and operating systems other than those mentioned. A preferred embodiment may be written using eXtensible Markup Language (XML), C, and/or C++ language, or other programming languages, along with an object oriented programming methodology. Object oriented programming (OOP), which has become increasingly used to develop complex applications, may be used.

Figure 3:
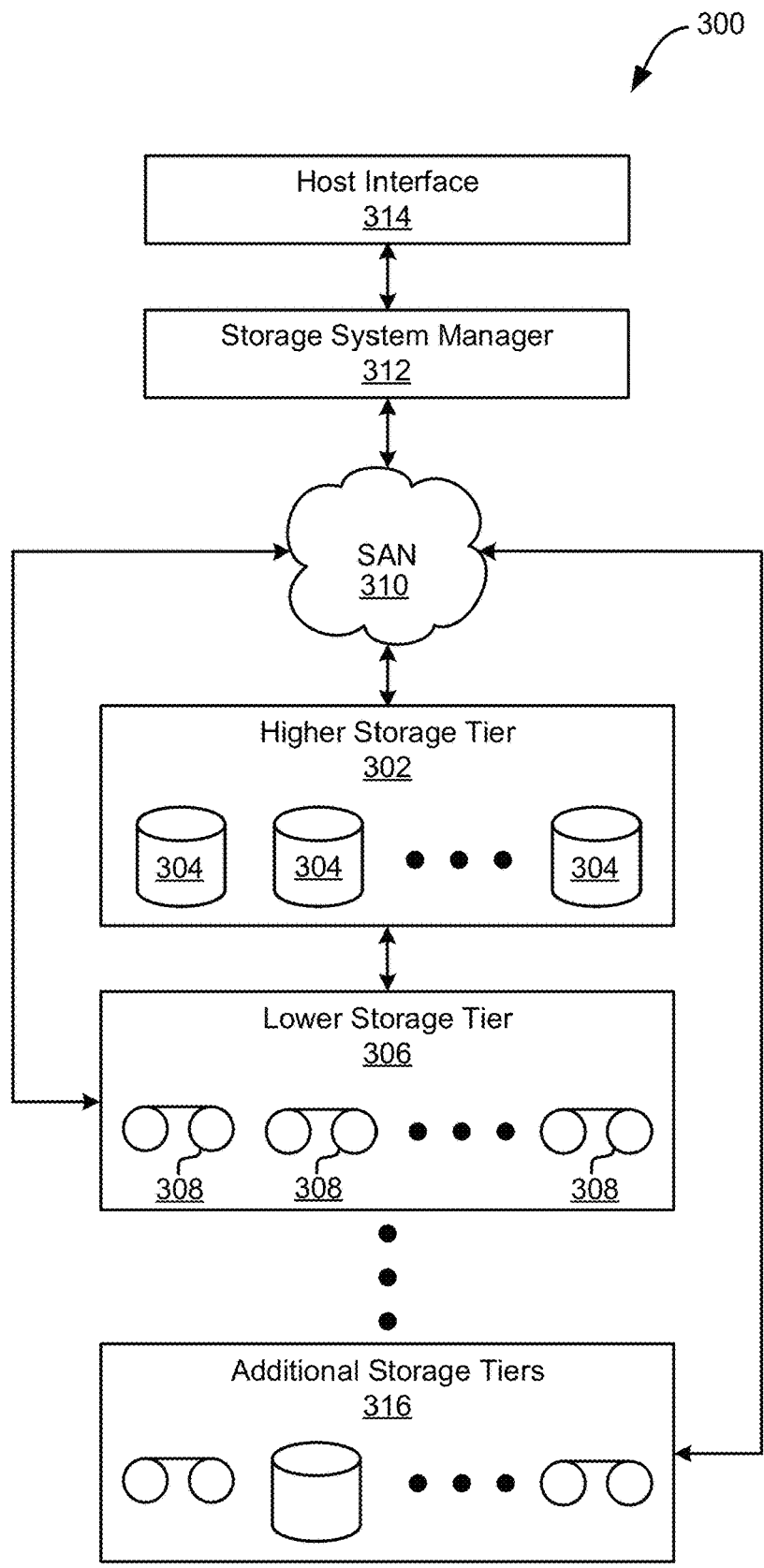
FIG. 3 illustrates a tiered data storage system in accordance with one embodiment.

Now referring to FIG. 3, a storage system 300 is shown according to one embodiment. Note that some of the elements shown in FIG. 3 may be implemented as hardware and/or software, according to various embodiments. The storage system 300 may include a storage system manager 312 for communicating with a plurality of media and/or drives on at least one higher storage tier 302 and at least one lower storage tier 306. The higher storage tier(s) 302 preferably may include one or more random access and/or direct access media 304, such as hard disks in hard disk drives (HDDs), nonvolatile memory (NVM), solid state memory in solid state drives (SSDs), flash memory, SSD arrays, flash memory arrays, etc., and/or others noted herein or known in the art. The lower storage tier(s) 306 may preferably include one or more lower performing storage media 308, including sequential access media such as magnetic tape in tape drives and/or optical media, slower accessing HDDs, slower accessing SSDs, etc., and/or others noted herein or known in the art. One or more additional storage tiers 316 may include any combination of storage memory media as desired by a designer of the system 300. Also, any of the higher storage tiers 302 and/or the lower storage tiers 306 may include some combination of storage devices and/or storage media.

The storage system manager 312 may communicate with the drives and/or storage media 304, 308 on the higher storage tier(s) 302 and lower storage tier(s) 306 through a network 310, such as a storage area network (SAN), as shown in FIG. 3, or some other suitable network type. The storage system manager 312 may also communicate with one or more host systems (not shown) through a host interface 314, which may or may not be a part of the storage system manager 312. The storage system manager 312 and/or any other component of the storage system 300 may be implemented in hardware and/or software, and may make use of a processor (not shown) for executing commands of a type known in the art, such as a central processing unit (CPU), a field programmable gate array (FPGA), an application specific integrated circuit (ASIC), etc. Of course, any arrangement of a storage system may be used, as will be apparent to those of skill in the art upon reading the present description.

In more embodiments, the storage system 300 may include any number of data storage tiers, and may include the same or different storage memory media within each storage tier. For example, each data storage tier may include the same type of storage memory media, such as HDDs, SSDs, sequential access media (tape in tape drives, optical disc in optical disc drives, etc.), direct access media (CD-ROM, DVD-ROM, etc.), or any combination of media storage types. In one such configuration, a higher storage tier 302, may include a majority of SSD storage media for storing data in a higher performing storage environment, and remaining storage tiers, including lower storage tier 306 and additional storage tiers 316 may include any combination of SSDs, HDDs, tape drives, etc., for storing data in a lower performing storage environment. In this way, more frequently accessed data, data having a higher priority, data needing to be accessed more quickly, etc., may be stored to the higher storage tier 302, while data not having one of these attributes may be stored to the additional storage tiers 316, including lower storage tier 306. Of course, one of skill in the art, upon reading the present descriptions, may devise many other combinations of storage media types to implement into different storage schemes, according to the embodiments presented herein.

According to some embodiments, the storage system (such as 300) may include logic configured to receive a request to open a data set, logic configured to determine if the requested data set is stored to a lower storage tier 306 of a tiered data storage system 300 in multiple associated portions, logic configured to move each associated portion of the requested data set to a higher storage tier 302 of the tiered data storage system 300, and logic configured to assemble the requested data set on the higher storage tier 302 of the tiered data storage system 300 from the associated portions.

Of course, this logic may be implemented as a method on any device and/or system or as a computer program product, according to various embodiments.

Error detection and/or correction codes are limited in the number of bits the codes may detect and/or correct in the data stream. Often, there are significant costs associated with error detection and/or correction schemes, especially for error detection and/or correction schemes which provide relatively more bit detection and/or correction abilities.

In one approach, classic BR codes with r parity columns comprise (p−1)×k (binary) arrays, where p is a prime number and k≤p. Each line of slope i, 0≤i≤r−1, has even parity when the lines are taken toroidally. Even parity comprises, for a given set of bits, the occurrence of bits whose value is 1 is counted. If the occurrence of bits is odd, the parity bit value is set to 1, making the total count of occurrences of is in the whole set an even number. If the count of 1s is even, the parity bit value is set to 0.

Figures 4, 5, 6, 7:
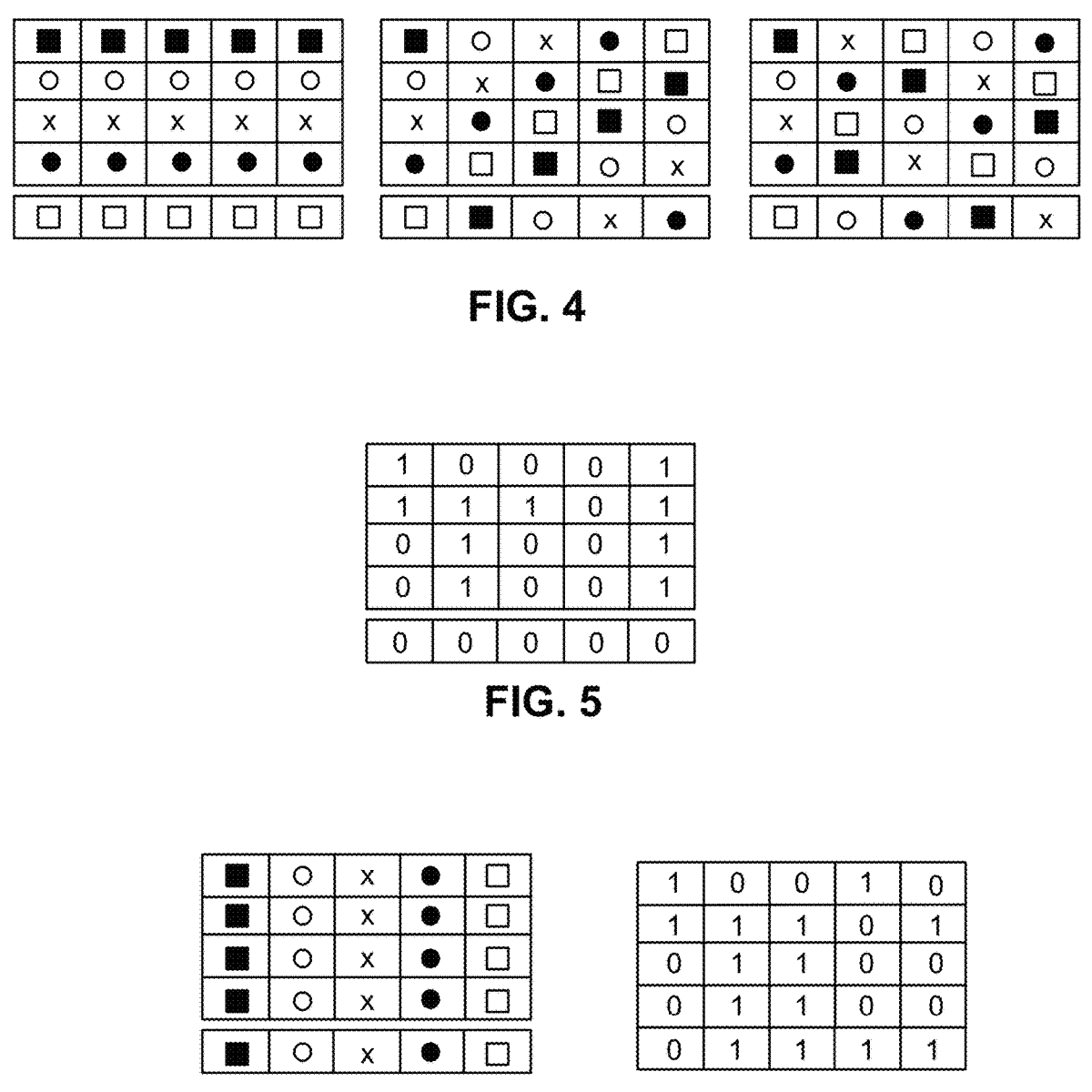

FIG. 4 is an exemplary array for p=k=5 and r=3. The lines shown are of slope 0 (e.g. the horizontal lines), slope 1, and slope 2 respectively. A fifth row of imaginary "zeros" is added to facilitate this description. Each of the lines has an even parity (e.g. an even number of ones) in classic BR codes.

FIG. 5 is an exemplary 4×5 array in a BR code. Each line of slope 0, slope 1, and slope 2 has an even parity. It should be noted that the last row of zeros is an imaginary row which is not written.

In one approach, an equivalent description of BR codes may include the following algebraic formulation. Consider a ring of polynomials modulo $M_p(x)=1+x+x^2+ \ldots +x^{p-1}$. Each column in the array may be considered an element in the polynomial ring in at least some approaches. Let $M_p(\alpha)=0$. A parity check matrix of the code is a Reed-Solomon (RS) type matrix:

$$H_{p,r} = \begin{pmatrix} 1 & 1 & 1 & \cdots & 1 \\ 1 & \alpha & \alpha^2 & \cdots & \alpha^{p-1} \\ 1 & \alpha^2 & \alpha^4 & \cdots & \alpha^{2(p-1)} \\ \vdots & \vdots & \vdots & \ddots & \vdots \\ 1 & \alpha^{r-1} & \alpha^{2(r-1)} & \cdots & \alpha^{(r-1)(p-1)} \end{pmatrix} \quad (1)$$

The inventive expansion to BR codes disclosed herein adds a vertical parity to the r parities of slope i for 0≤i≤r−1. The vertical parity may be interpreted as a line of slope infinity. Each line of slope 0, slope 1, and slope 2 in an EBR code has an even parity.

Definition of EBR Codes

Let p be a prime, $R_p$ be the ring of polynomials modulo $1+x^p$, and let $R_p^{(0)}$ contained in $R_p$ be the ideal of polynomials modulo $1+x^p$ of even weight. If $\alpha^p=1$, an expanded Blaum-Roth code, EBR(p, r), is the [p, p−r] code over $R_p^{(0)}$ whose parity-check matrix is given by (1).

In one approach, the definitions of EBR codes and BR codes share parity-check matrix (1). The elements of a BR code may be within the ring of polynomials modulo $M_p(x)$ and $M_p(\alpha)=0$. The elements of an EBR code may be in the ideal $R_p^{(0)}$ and $\alpha^p=1$. Geometrically, the elements of EBR(p, r) codes are p×p arrays such that each column has an even parity and any line of slope j for 0≤j≤r−1 has an even parity.

Again, FIG. 4 is an exemplary array comprising lines of slope 0, 1 and 2 having even parity in a BR(5,3), while FIG. 5 is an exemplary element in BR(5,3) with an imaginary 4th row of zeros. FIG. 6 is an exemplary element comprising lines of slope ∞ having even parity in EBR(5,3).

FIG. 7 is an exemplary element in EBR(5, 3) wherein each column has even parity (e.g., each column is in $R_s^{(0)}$. Every line of slope 0, 1, and 2 has even parity.

EBR codes and other array codes (e.g. BR codes, EVENODD, generalized EVENODD, Row-Diagonal Parity (RDP), generalized RDP, etc.) may have similar applications. Array codes may be used in Redundant Array of Independent Disks (RAID) type architectures (e.g. RAID 6 which requires two parity columns). In some approaches, array codes may be used as an alternative to RS codes which require finite field operations. RS codes are conventionally used to correct a plurality of errors and erasures. Erasures herein may be defined as one or more bits which are unreadable for any reason. RS codes are non-binary cyclic error correction codes which may detect and correct multiple random symbol errors. RS codes using finite field operations are often complex and expensive to process.

Array codes may be based on XOR operations and are conventionally less complex than codes based on finite field operations. Array codes naturally provide horizontal locality and may be used as Locally Recoverable Codes (LRC). Array codes may not have vertical parity.

In one embodiment, array codes may be used in the cloud. In some approaches, each entry may correspond to a whole device. In some applications, each column represents a device and each entry represents a sector and/or a page in a device. Erasure codes involving local and global parities may be invoked.

An array code with vertical parity may provide the benefit of parity within a device. In one approach, a failed sector and/or page within a device may be recovered locally without invoking other devices (e.g. a first responder type of approach). A sector and/or page within a device may fail if an internal error-correcting code (ECC) is exceeded and detected by the cyclic redundancy check (CRC). An array code with a vertical parity in each column may be used for local recovery, however, the column parities are not protected by the other parities.

EBR codes may use only XOR operations which are inexpensive and fast to process. EBR codes may be implemented into software defined storage systems.

EBR codes with r column parties may recover any r erased columns and up to r erased lines of slope j, $0 \leq j \leq r-1$ while the column parities are protected by the other parities. EBR codes may recover erasures without having to invoke data from the whole storage system and without reference to other columns. Conventionally, the farther data is pulled from over a network, the more expensive error correction and/or detection is. Locally recoverable properties are desirable for error correction and/or detection schemes.

FIG. 8 illustrates a 5×5 0-array for p=5 and r=2. A 4×3 data array comprising zeros may be encoded into a 4×5 BR code. A parity row may be added resulting in the 5×5 0-array as shown. In this example, two lines of slope 1 are erased (e.g. diagonals 1 and 4) where E corresponds to an erasure.

FIG. 9 illustrates two possible solutions for the erasures using a classic BR code with an additional parity row. Specifically, a line of vertical parity replaces the line of imaginary zeros in the BR code. (See FIGS. 4-5). In a situation where there is more than one result for the erasures, the erasures are uncorrectable. A situation with more than one solution exceeds the power of the code. The first four rows of the second solution correspond to a BR code with r=2 where each column has an even number of ones such that the array is within the code.

If the 4×3 data array of zeros is encoded into a 5×5 array using an EBR code, there is one unique solution. The diagonal of slope 1 in the second solution does not have even parity. EBR codes do not allow odd parities in diagonals of slope 1. The first solution is the unique solution for the erasures using an EBR code and the erasures may be corrected when there is only one possible solution.

In some approaches, each entry represents a page and/or a sector (e.g. a 64K sector) and the parity sectors may be obtained as XORs of data sectors, by linearity. The parity sectors may inherit any CRC bits (e.g. the CRC of the parity sectors do not need to be computed which saves time, money, and/or processing power). EBR codes provide multiple localities for recovering a single failed symbol.

Decoding of EBR Codes

In one approach, decoding the p×(k+r) array comprises recovering an erased symbol which is in any column. The erased symbol may be in any line of slope j for $0 \leq j \leq r-1$. In one approach, no other symbols in the column and/or the line may be erased. The decoding method for the p×(k+r) array may comprise recovering erasure patterns by iteratively recovering an erased symbol which is in any column.

The erased symbol may be in any line of slope j for $0 \leq j \leq r-1$. In one approach, no other symbols in the column and/or the line may be erased.

In one approach, the decoding method may comprise obtaining r syndrome vectors of length p for $0 \leq i \leq r-1$. The r syndrome vectors may comprise an XOR of the symbols over each line of slope i in the p×(k+r) array.

In another approach, the decoding method includes obtaining up to r erased columns using a recursive procedure as a function of the syndrome vectors. The up to r erased columns may be initially assumed to be zero.

In one approach, the recovered p×(k+r) array may be output.

Specifically, for any integer l, the unique integer m may be denoted by $<l>$, such that $0 \leq m \leq p-1$ and $m \equiv l \pmod p$. Integer $<l>_p$ may be interchangeably denoted by $<l>$, herein.

The following lemma gives a recursion for decoding EBR codes (See also Equation (7) and Equation (13) to be discussed below).

Lemma

Let p be a prime number, $\alpha^p = 1$, $\underline{x}(\alpha) = \bigoplus_{i=0}^{p-1} x_i \alpha^i \in R_p^{(0)}$ and $1 \leq j \leq p-1$. The recursion $(1 \oplus \alpha^j)\vec{z}(\alpha) = \underline{x}(\alpha)$ has a unique solution in $R_p^{(0)}$. Specifically, if $\underline{z}(\alpha) = \bigoplus_{i=0}^{p-1} z_i \alpha^i$, then $$z_0 = \bigoplus_{u=1}^{\frac{(p-1)}{2}} x_{\langle 2uj \rangle} \quad (2)$$

$$z_{\langle ij \rangle} = z_{\langle (i-1)j \rangle} \oplus x_{\langle ij \rangle} \text{ for } 1 \leq i \leq p-1. \quad (3)$$

Example 1

Let p=7, $\underline{x}(\alpha) = 1 \oplus \alpha^3 \oplus \alpha^4 \oplus \alpha^6$, e.g., $x_0=1$, $x_1=0$, $x_2=0$, $x_3=1$, $x_4=1$, $x_5=0$ and $x_6=1$. Solve the recursion $(1 \oplus \alpha^3)\underline{z}(\alpha) = \underline{x}(\alpha)$. According to (2) and (3), $z_0 = x_2 \oplus x_4 \oplus x_6 = 0$ $z_3 = z_0 \oplus x_3 = 1$ $z_6 = z_3 \oplus x_6 = 0$ $z_2 = z_6 \oplus x_2 = 0$ $z_5 = z_2 \oplus x_5 = 0$ $z_1 = z_5 \oplus x_1 = 0$ $z_4 = z_1 \oplus x_4 = 1$, and $\underline{z}(\alpha) = \alpha^3 \oplus \alpha^4$.

The recursion comprise $$\frac{3p-5}{2}$$

XOR operations.

The technique for correcting r erased columns in classic BR codes may be adapted to correct up to r erased columns in EBR codes. Assume that columns $i_0, i_1, \ldots, i_{\rho-1}$ have been erased, where $\rho \leq r$, and the erased value of column $i_s$ denoted by $E_s$. The polynomial G(x) of degree $\rho$ is defined as $$G(x) = \prod_{s=1}^{p-1}(x \oplus \alpha^{is}) = \bigoplus_{s=0}^{p-1} g_s x^s. \quad (4)$$

Notice that, $$G(\alpha^{i0}) = \Pi_{s=1}^{p-1}(\alpha^{i0} \oplus \alpha^{is}) \quad (5)$$

$$G(\alpha^{ij}) = 0 \text{ for } j \neq 0. \quad (6)$$

Denote the columns of the array by $C_u$, where $0 \leq u \leq r-1$. Assuming that the erased columns are zeros, compute the syndrome vectors $$S^{(j)} = \bigoplus_{u=0}^{p-1} \alpha^{ju} C_u \text{ for } 0 \leq j \leq \rho-1. \quad (7)$$

From the parity-check matrix (1) and (7), $$S^{(j)} = \bigoplus_{s=0}^{p-1} \alpha^{jis} E_s \text{ for } 0 \leq j \leq \rho-1. \quad (8)$$

Define the next polynomial $$S(x) = \bigoplus_{j=0}^{p-1} S^{(j)} x^j, \quad (9)$$

then, from (4), (5), (8) and (9), $$\bigoplus_{j=0}^{p-1} g_j S^{(j)} = \bigoplus_{j=0}^{p-1} g_j \bigoplus_{s=0}^{p-1} \alpha^{jis} E_s \quad (10)$$

$$= \bigoplus_{s=0}^{p-1} E_s \bigoplus_{j=0}^{p-1} g_j (\alpha^{is})^j$$

$$= \bigoplus_{s=0}^{p-1} E_s G(\alpha^{is})$$

$$= \left( \prod_{s=1}^{p-1}(\alpha^{i0} \oplus \alpha^{is}) \right) E_0.$$

From (10), compute $\bigoplus_{j=0}^{p-1} g_j S_j$. Obtain $E_0$ by applying the recursion given by (2) and (3), $\rho-1$ times. Once $E_0$ is obtained, $\rho-1$ erasures remain. Proceed by induction.

Example 2

FIG. 10 is an illustrative decoding procedure for an EBR(5, 3) where E denotes an erasure. Columns 1, 3, and 4 are erased. Column 0 and 2 comprise one erased element. The even parity within the columns may be used to obtain the erased element in columns 0 and 2.

FIG. 11 is the result of using the even parity in columns 0 and 2 to obtain the erased elements of FIG. 10.

By (4), $$G(x) = (x \oplus \alpha^3)(x \oplus \alpha^4) = \alpha^2 \oplus (\alpha^3 \oplus \alpha^4)x \oplus x^2.$$

Assume the erased columns are zero and compute the syndrome vectors, $$S_0 = 1 \oplus \alpha^2 \oplus \alpha^3 \oplus \alpha^4$$

$$S_1 = \alpha^3 \oplus \alpha^4$$

$$S_2 = \alpha^2 \oplus \alpha^3.$$

Compute, $$g_0 S_0 \oplus g_1 S_1 \oplus g_2 S_2 = 1 \oplus \alpha^4.$$

Solve the double recursion, $$(\alpha \oplus \alpha^3)(\alpha \oplus \alpha^4) E_0 = 1 \oplus \alpha^4,$$

or, multiply both sides by $\alpha^{-2}$, $$(1 \oplus \alpha^2)(1 \oplus \alpha^3) E_0 = \alpha^2 \oplus \alpha^3.$$

Let $(1 \oplus \alpha^3) E_0 = V_0$, then solve first $$(1 \oplus \alpha^2) V_0 = \alpha^2 \oplus \alpha^3.$$

Apply the recursion given by (2) and (3) to obtain, $$V_0 = 1 \oplus \alpha^3.$$

Solve $$(1 \oplus \alpha^3) E_0 = 1 \oplus \alpha^3 \text{ and}$$

$$E_0 = \alpha \oplus \alpha^2 \oplus \alpha^3 \oplus \alpha^4.$$

Recompute the syndrome vectors, $$S_0 = S_0 \oplus E_0 = 1 \oplus \alpha$$

$$S_1 = S_1 \oplus \alpha E_0 = 1 \oplus \alpha^2.$$

Repeating the procedure for two erasures, obtain $$G(x) = x \oplus \alpha^4 \text{ and}$$

$$g_0 S_0 \oplus g_1 S_1 = \alpha^2 \oplus \alpha^4.$$

Solve the recursion $$(\alpha^3 \oplus \alpha^4) E_1 = \alpha^2 \oplus \alpha^4,$$

or, multiply both sides by $\alpha^{-3}$, $$(1 \oplus \alpha) E_1 = \alpha \oplus \alpha^4.$$

Solve the recursion using the lemma, obtain $$E_1 = 1 \oplus \alpha^4.$$

Compute $$S_0 = S_0 \oplus E_1 = \alpha \oplus \alpha^4 = E_2.$$

FIG. 12 is the final decoded array of FIG. 10 using the foregoing method.

Encoding of EBR Codes

In one approach, the method for encoding an array of $(p-1) \times k$ symbols into a $p \times (k+r)$ array comprises p as a prime number, $r \geq 1$, and $k \leq p-r$. In some approaches, the method includes each column in the $p \times (k+r)$ array comprising an even parity. In one approach, each line of slope j for $0 \leq j \leq r-1$ in the $p \times (k+r)$ array has an even parity. The lines of slope j may be taken with a toroidal topology modulo p.

In one approach, a parity row is appended to a $(p-1) \times k$ array to form a $p \times k$ array.

The method for encoding the array of $(p-1) \times k$ symbols into a $p \times (k+r)$ array may comprise computing r syndrome vectors of length p. In one approach, the symbols of the syndrome vector i for $0 \leq i \leq r-1$, are XOR of symbols in each of the p lines of slope i in the $p \times k$ array.

In one approach, the method comprises applying an iterative procedure over the syndrome vectors in order to obtain r parity columns. The r parity columns may be appended to the p×k array. In another approach, the p×(k+r) encoded array may be output.

In some approaches, encoding is a special case of decoding. For example, a last row of an array and the last r columns may be used to store the parities. In this approach, if the locations of the erasures are known, the coefficients of $G(x)=\Pi_{j=1}^{r-1}(x \oplus \alpha^{p-r+j})$ may be precomputed. Precomputing the coefficients increases the speed of processing.

The number of columns may be any number. For example, in Example 2 described above, the k=p−r columns carry information, where p is a prime and 1≤r<p. There may be 1≤k≤p−r data columns. If k<p−r, the array may be padded with p−r−k zero columns to encode the data into a p×p array. The zero columns may be removed when outputting the final p×(k+r) encoded array.

In one approach, the expanded BR code is denoted by EBR(p, k, r). In this approach, the EBR(p, r) code corresponds to an EBR(p, p−r, r) code.

Example 3

Figures 13, 14, 15:
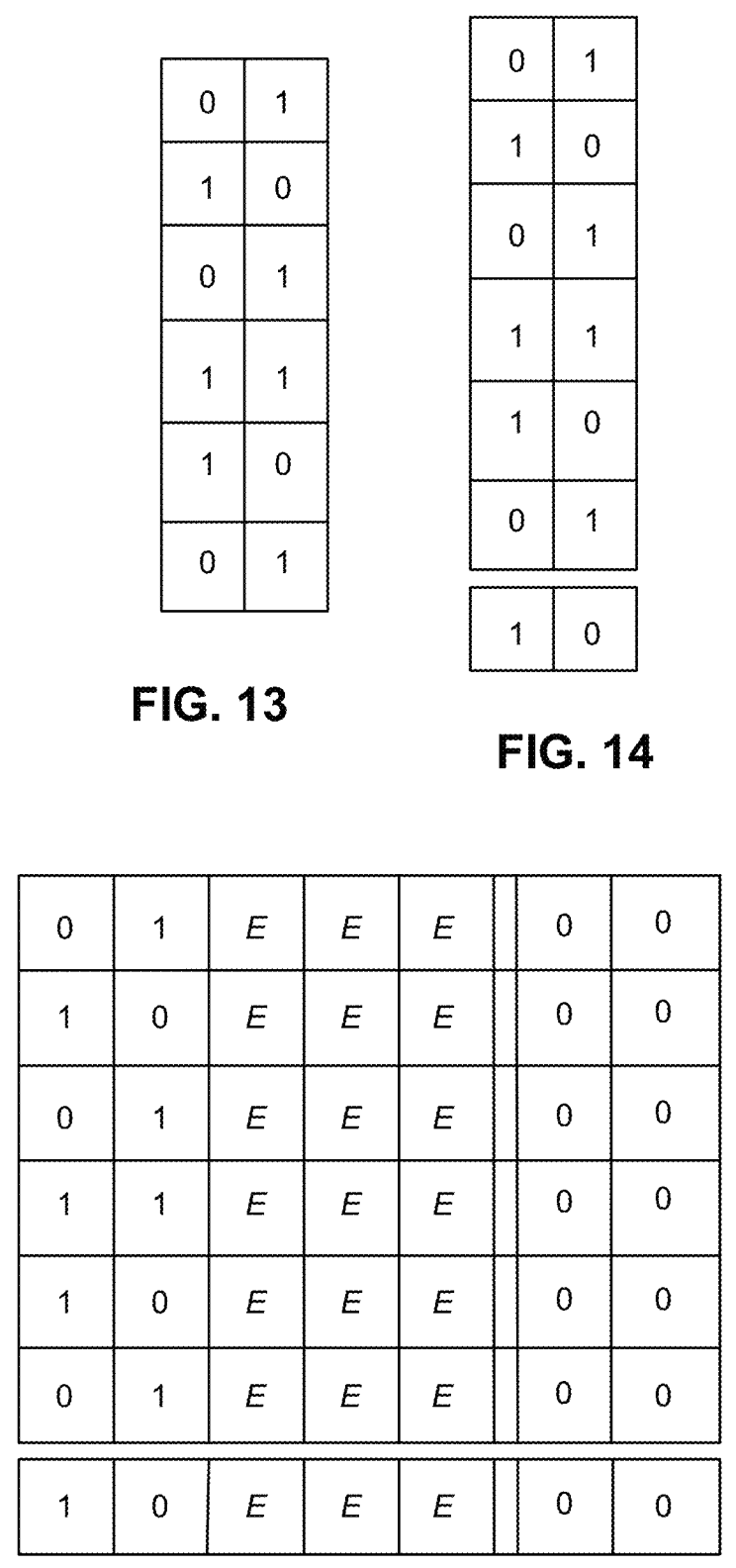

FIG. 13 is an exemplary 6×2 array for encoding into a 7×5 array. Consider EBR(7, 2, 3) where p=7, k=2, and r=3.

FIG. 14 illustrates the output of performing the initial operation of the encoding which may comprise adding a $7^{th}$ row which is the XOR of the first 6 rows. The output is an exemplary 7×2 array.

FIG. 15 illustrates the output of performing the padding operation. In order to implement the decoding procedure, illustrated above in Example 2, the next operation includes padding the 7×7 array with two (e.g. p−r−k) zero columns where k<p−r.

The erased columns 2, 3, and 4 are denoted by E.

By (4), considering $\alpha^7=1$, obtain $G(x)=(x \oplus \alpha^3)(x \oplus \alpha^4)=1 \oplus (\alpha^3 \oplus \alpha^4)x \oplus x^2$.

Assume that the erased columns are zero when computing the syndrome vectors to obtain $S_0=1 \oplus \alpha \oplus \alpha^2 \oplus \alpha^4 \oplus \alpha^5 \oplus \alpha^6$ $S_1=0$ $S_2=1 \oplus a \oplus \alpha^2 \oplus \alpha^3 \oplus \alpha^5 \oplus \alpha^6$.

Compute $g_0 S_0 \oplus g_1 S_1 \oplus g_2 S_2 = \alpha^3 \oplus \alpha^4$.

Solve the double recursion $(\alpha^2 \oplus \alpha^3)(\alpha^2 \oplus \alpha^4)E_0 = \alpha^3 \oplus \alpha^4$, or, multiply both sides by $\alpha^{-4}$, $(1 \oplus \alpha)(1 \oplus \alpha^2) E_0 = 1 \oplus \alpha^6$.

Let $(1 \oplus \alpha^2) E_0 = V_0$, then solve first $(1 \oplus \alpha)V_0 = 1 \oplus \alpha^6$.

Apply the recursion given by (2) and (3) to obtain, $V_0 = 1 \oplus \alpha \oplus \alpha^2 \oplus \alpha^3 \oplus \alpha^4 \oplus \alpha^5$.

Solve $(1 \oplus \alpha^2)E_0 = 1 \oplus \alpha \oplus \alpha^2 \oplus \alpha^3 \oplus \alpha^4 \oplus \alpha^5$ and $E_0 = 1 \oplus \alpha^3 \oplus \alpha^4 \oplus \alpha^6$.

Recompute the syndrome vectors, $S_0 = S_0 \oplus E_0 = \alpha \oplus \alpha^2 \oplus \alpha^3 \oplus \alpha^5$ $S_1 = S_1 \oplus \alpha^2 E_0 = \alpha \oplus \alpha^2 \oplus \alpha^5 \oplus \alpha^6$.

Repeating the procedure for two erasures, obtain $G(x) = \alpha^4 \oplus x$ and $g_0 S_0 \oplus g_1 S_1 = 1 \oplus \alpha$.

Solve the recursion $(\alpha^3 \oplus \alpha^4)E_1 = 1 \oplus \alpha$, or, multiply both sides by $\alpha^{-3}$, $1(1 \oplus \alpha)E_1 = \alpha^4 \oplus \alpha^5$.

Solve the recursion using the lemma, obtain $E_1 = 1 \oplus \alpha \oplus \alpha^2 \oplus \alpha^3 \oplus \alpha^5 \oplus \alpha^6$.

Compute $S_0 = S_0 \oplus E_1 = 1 \oplus \alpha^6 = E_2$.

FIG. 16 is the final decoded array of FIG. 15 using the foregoing method. The zero columns may be removed when outputting the final decoded array.

Encoding and Decoding of EBR(p, 2)

The specific case of r=2 may be encoded and/or decoded using the method as described above. Alternatively, the specific case of r=2 may be encoded and/or decoded using a relatively more efficient method which reduces the total number of XOR operations used to recover the erasures. The enhanced decoding algorithm of EBR(p, 2) (discussed in further detail below) reduces the total number of XOR operations by eliminating redundant operations.

For encoding a (p−1)×k array with entries $a_{u,v}$, where 0≤u≤p−2 and 0≤v≤k−1, into a EBR(p, k, 2), where p is a prime and k≤p−2, the method corresponds to encoding a (p−1)×(p−2) array such that the first k columns corresponds to the array to be encoded while the last p−2−k columns are zero.

In one approach, obtain the symbols $a_{p-1,j}$ for 0≤j≤k−1 by $$a_{p-1,j} = \bigoplus_{u=0}^{p-2} a_{u,j} \quad (11)$$

For each 0≤j≤k−1, compute $a_{p-1,j}$ according to (11).

Each of the computations in (11) may comprise p−2 XOR operations. For k computations, computing the $a_{p-1,v}$s for 0≤v≤k−1 may comprise k(p−2) XOR operations.

Using the decoding method described above, assume that columns k and k+1 have been erased. For columns $C_j$, for 0≤j≤k−1, where $C_j = \bigoplus_{i=0}^{p-1} a_{i,j} \alpha^i$, obtain columns $C_k$ and $C_{k+1}$. In one approach, compute $C_{k+1} = C_k \oplus S^{(0)}$ and let $C_{k+1} = \bigoplus_{u=0}^{p-1} a_{u,k+1} \alpha^u$.

Define the polynomial $G(x) = G(x) = \alpha^{p-1} \oplus x$.

In one approach, compute the syndrome vectors $S^{(0)}$ and $S^{(1)}$. According to (7), $$S^{(0)} = \bigoplus_{j=0}^{k-1} C_j \quad (12)$$

$$S^{(1)} = \bigoplus_{j=0}^{k-1} \alpha^j C_j \quad (13)$$

If $S^{(v)} = \bigoplus_{i=0}^{p-1} s^{(v)} \alpha^i$ for 0≤v≤1, then (12) and (13) become $$s_i^{(0)} = \bigoplus_{j=0}^{k-1} a_{i,j} \quad (14)$$

-continued $$s_i^{(1)} = \bigoplus_{j=0}^{k-1} a_{\langle i-j \rangle, j} \text{ for each } i, 0 \leq i \leq p-1. \tag{15}$$

The computation of the syndrome vectors $S^{(0)}$ and $S^{(1)}$, according to (12), (13), (14) and (15) comprises $2(k-1)p$ XOR operations.

According to (10), take $E_0 = C_k = \bigoplus_{u=0}^{p-1} a_{u,k} \alpha^u$, and solve $$(\alpha^{p-2} \oplus \alpha^{p-1})C_k = \alpha^{p-1} S^{(0)} \oplus S^{(1)},$$

or, multiply both sides by $\alpha^2$ to obtain $$(1 \oplus \alpha)C_k = \alpha S^{(0)} \oplus \alpha^2 S^{(1)}. \tag{16}$$

Computing the right-hand side of equation (16) comprises p XOR operations and solving the recursion comprise $$\frac{3p-5}{2}$$

XOR operations.

Obtain $C_{k+1} = C_k \oplus S^{(0)}$, which comprises another p XOR operations. The total number of XOR operations in the encoding method as described comprise $$\frac{3p(2k+1) - 4k - 5}{2}$$

XOR operations.

In one approach, the encoded p×k array $(a_{u,v})$, $0 \leq v \leq k+1$ may be output.

In another approach, the method may include computing an initial symbol in a first parity column as a function of two syndrome vectors. The remaining parity symbols may be computed using a recursive procedure comprising the syndrome vectors and previously computed parity symbols.

Enhanced Encoding Algorithm for EBR(p, k, 2)

The following operations comprise a method for reducing the number of XOR operations at the encoding. XOR operations may be reduced where the encoding comprises redundant operations. Specifically, the recursion (16) may be used for reducing the number of XOR operations. According to (12), (13), (14), and (15), the right-hand side of (16) is given by $$\alpha S^{(0)} \oplus \alpha^2 S^{(1)} = \bigoplus_{v=0}^{p-1} x_v \alpha^v, \text{ where} \tag{17}$$

$$x_v = s_{\langle v-1 \rangle}^{(0)} \oplus s_{\langle v-2 \rangle}^{(1)} \text{ for } 0 \leq v \leq p-1. \tag{18}$$

A bottleneck for solving recursion (16) occurs in computing the first element $a_{0,k}$. The first element $a_{0,k}$ according to (2), is $$a_{0,k} = \bigoplus_{u=0}^{\frac{(p-3)}{2}} x_{\langle 2u+2 \rangle}. \tag{19}$$

By (18), $$a_{0,k} = \left( \bigoplus_{u=0}^{\frac{(p-3)}{2}} s_{\langle 2u+1 \rangle}^{(0)} \right) \oplus \left( \bigoplus_{u=0}^{\frac{(p-3)}{2}} s_{\langle 2u \rangle}^{(1)} \right). \tag{20}$$

Using (14) and (15), (2) becomes $$a_{0,k} = \left( \bigoplus_{u=0}^{\frac{(p-3)}{2}} \bigoplus_{j=0}^{k-1} a_{\langle 2u+1 \rangle, j} \right) \oplus \left( \bigoplus_{u=0}^{\frac{(p-3)}{2}} \bigoplus_{j=0}^{k-1} a_{\langle 2u-j \rangle, j} \right) \tag{21}$$

$$= \left( \bigoplus_{j=0}^{k-1} \bigoplus_{u=0}^{\frac{(p-3)}{2}} a_{\langle 2u+1 \rangle, j} \right) \oplus \left( \bigoplus_{j=0}^{k-1} \bigoplus_{u=0}^{\frac{(p-3)}{2}} a_{\langle 2u-j \rangle, j} \right)$$

$$= \bigoplus_{j=0}^{k-1} W_j, \text{ where}$$

$$W_j = \bigoplus_{u=0}^{\frac{(p-3)}{2}} (a_{\langle 2u+1 \rangle, j} \oplus a_{\langle 2u-j \rangle, j}) \text{ for } 0 \leq j \leq k-1. \tag{22}$$

From (22), $$W_j = \bigoplus_{i=0}^{p-j-2} a_{i,j} \text{ for } 0 \leq j \leq k-1. \tag{23}$$

From (23), compute and store the $W_j$s when computing $a_{p-1,j}$ according to (11). Computing and storing the $W_j$s when computing $a_{p-1,j}$ prevents computing the $W_j$s more than once. Equation (21) comprises k−1 XOR operations.

In response to obtaining $a_{0,k}$ from (21), obtain the symbols $a_{i,k+1}$ for $0 \leq i \leq p-1$ and $a_{i,k}$ for $1 \leq i \leq p-1$ using the following procedure, $$a_{i,k+1} = s_i^{(0)} \oplus a_{i,k} \text{ for } 0 \leq i \leq p-1, \text{ and}, \tag{24}$$

$$a_{i,k} = s_{\langle i-2 \rangle}^{(1)} \oplus a_{i-1,k+1} \text{ for } 1 \leq i \leq p-1. \tag{25}$$

The procedure comprises 2p−1 XOR operations. The modified encoding algorithm comprises (3p−1)k−2 XOR operations (e.g. less than the $$\frac{3p(2k+1) - 4k - 5}{2}$$

XOR operations for the previous encoding method).

Figure 17:
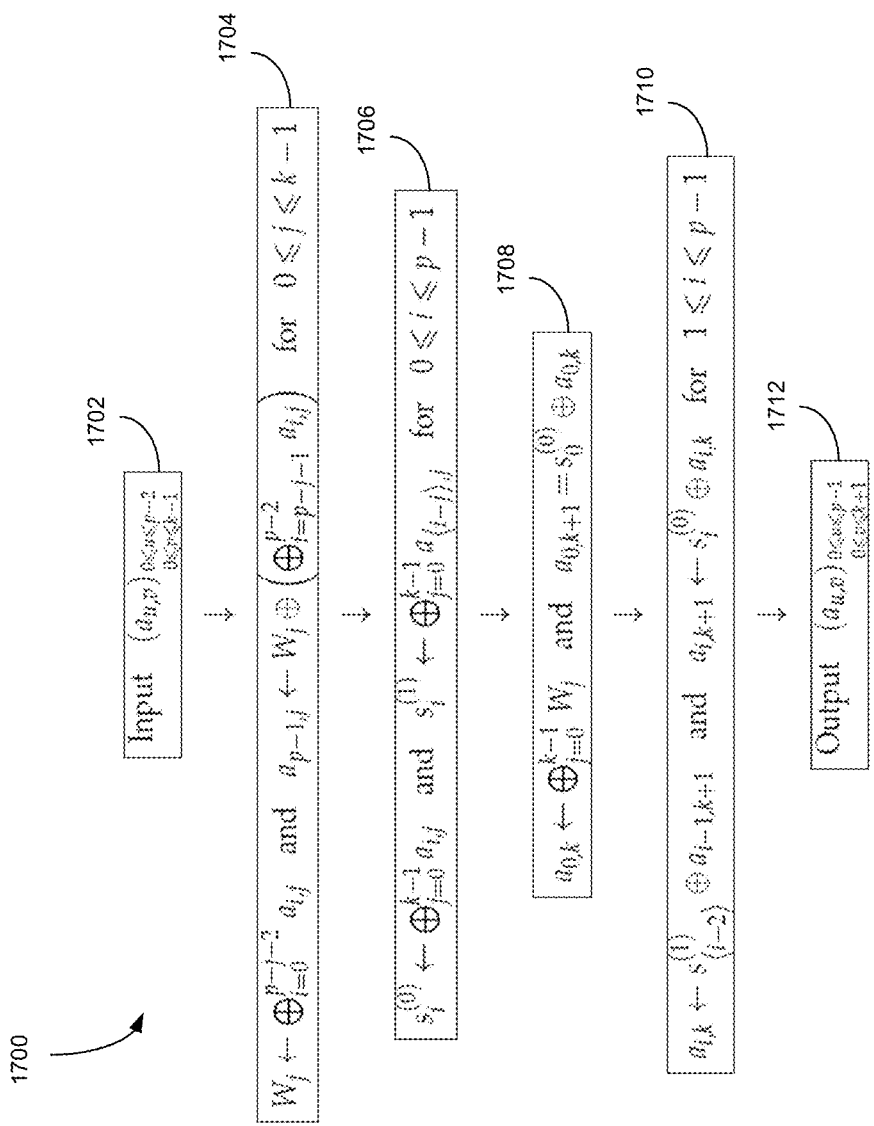
FIG. 17 is a flowchart of a method, according to one embodiment.

Now referring to FIG. 17, a flowchart of a method 1700 is shown according to one embodiment. The method 1700 may be performed in accordance with the present invention in any of the environments depicted in other FIGS., in various embodiments. Of course, more or less operations than those specifically described in FIG. 17 may be included in method 1700, as would be understood by one of skill in the art upon reading the present descriptions.

Each of the steps of the method 1700 may be performed by any suitable component of the operating environment. For example, in various embodiments, the method 1700 may be partially or entirely performed by computers, or some other device having one or more processors therein. The processor, e.g., processing circuit(s), chip(s), and/or module(s) implemented in hardware and/or software, and preferably having at least one hardware component may be utilized in any device to perform one or more steps of the method 1700. Illustrative processors include, but are not limited to, a central processing unit (CPU), an application specific integrated circuit (ASIC), a field programmable gate array (FPGA), etc., combinations thereof, or any other suitable computing device known in the art.

As shown in FIG. 17, method 1700 may initiate with operation 1702, including inputting a (p−1)×k array $(a_{u,v})$, $0 \le u \le p-2$ and $0 \le v \le k-1$, where p is a prime number and $1 \le k \le p-2$.

Operation 1704 includes, for each $0 \le j \le k-1$, computing $W_j = \bigoplus_{i=0}^{p-j-2} a_{i,j}$ according to (23) and computing $a_{p-1,j} = W_j \oplus (\bigoplus_{i=p-j-1}^{p-2} a_{i,j})$ according to (11) and (23).

Operation 1706 includes computing $$s_i^{(0)} = \bigoplus_{j=0}^{k-1} a_{i,j}$$

according to (14) and $$s_i^{(1)} = \bigoplus_{j=0}^{k-1} a_{\langle i-j \rangle, j}$$

according to (15).

Operation 1708 includes computing $$a_{0,k} = \bigoplus_{j=0}^{k-1} W_j$$

according to (21) and $a_{0,k+1} = s_0^{(0)} \oplus a_{0,k}$.

Operation 1710 includes, for each $1 \le i \le p-1$, computing $a_{i,k} = s_{\langle i-2 \rangle}^{(1)} \oplus a_{i-1,k+1}$ according to (25) and $a_{i,k+1} = s_i^{(0)} \oplus a_{i,k}$ according to (24).

Operation 1712 includes outputting the encoded p×(k+2) array $(a_{u,v})$, $0 \le u \le p-1$ and $0 \le v \le k+1$.

In one approach, the method comprises an operation for computing XORs of each of the first p−u−1 symbols in each data column. The operation may comprise storing such XORed symbols for $0 \le u \le k-1$.

In another approach, the method comprises an operation for computing the parity symbols of each column by XORing the stored symbol with the last u symbols in the column.

The method may comprise computing an initial symbol corresponding to the first parity column by XORing the stored k symbols.

Figure 18:
FIG. 18 is a table comparing the number of XOR operations used for the encoding algorithm for EBR(p, k, 2) and the enhanced encoding algorithm for EBR(p, k, 2), according to one embodiment.

FIG. 18 is a table 1800 comparing the number of XOR operations used for the encoding algorithm for EBR(p, k, 2) and the enhanced encoding algorithm for EBR(p, k, 2).

As shown, the enhanced encoding algorithm for EBR(p, k, 2) comprises less XOR operations than the regular encoding algorithm for EBR(p, k, 2). The reduction in XOR operations is most significant when k<<p.

Decoding Algorithm for EBR(p, k, 2)

Consider a p×(k+2) array $(a_{u,v}) \in$ EBR(p, k, 2), $0 \le u \le p-1$ and $0 \le v \le k+1$, where p is a prime number and $1 \le k \le p-2$. Expand this array to a p×p array such that columns j, $0 \le j \le k-1$, remain the same, columns k to p−3 are zero, and columns p−2 and p−1 correspond to columns k and k+1 of the original array and $(a_{u,v}) \in$ EBR(p, 2) where $0 \le u$ and $v \le p-1$.

Assume columns i and j in the modified array are erased, where $0 \le i < j \le p-1$. Assume that each of the remaining columns include, at most, one erasure. Assume initially columns i and j are zero.

In one approach, columns with exactly one erasure may be corrected by XORing the remaining p−1 symbols in the column.

In another approach, the syndrome vectors $S^{(0)} = \bigoplus_{v=0}^{p-1} s_v^{(0)} \alpha^v$ and $S^{(1)} = \bigoplus_{v=0}^{p-1} s_v^{(1)} \alpha^v$ may be computed as follows:

$$s_v^{(0)} = \bigoplus_{w=0}^{p-1} a_{v,w}$$

$$s_v^{(1)} = \bigoplus_{w=0}^{p-1} a_{\langle v-w \rangle, w}.$$

Compute $$a_{0,i} = \bigoplus_{u=1}^{\frac{(p-1)}{2}} (s_{\langle(2u-1)(j-i)\rangle}^{(0)} \oplus s_{\langle 2u(j-i)+i \rangle}^{(1)})$$

$$a_{0,j} = s_0^{(0)} \oplus a_{0,i}.$$

For each $1 \le v \le p-1$, compute $$a_{\langle v(j-1) \rangle, i} = s_{\langle v(j-1)+i \rangle}^{(1)} \oplus a_{\langle (v-1)(j-i) \rangle, j}$$

$$a_{\langle v(j-i) \rangle, i} = s_{\langle v(j-1) \rangle}^{(0)} \oplus a_{\langle v(j-i) \rangle, i}.$$

The decoded p×k array $(a_{u,v})$, $0 \le u \le p-1$, $0 \le v \le k+1$ may be output after eliminating the zero-columns j, $k \le j \le p-3$.

EBR codes may retrieve more types of errors than those discussed above. For example, for situations where a column or a line of slope i, $0 \le i \le r-1$, has exactly one erasure, such an erasure may be recovered by XORing the remaining symbols in the line. The process comprising XORing the remaining symbols may be applied iteratively until no further erasure may be corrected.

Figures 19, 20, 21:
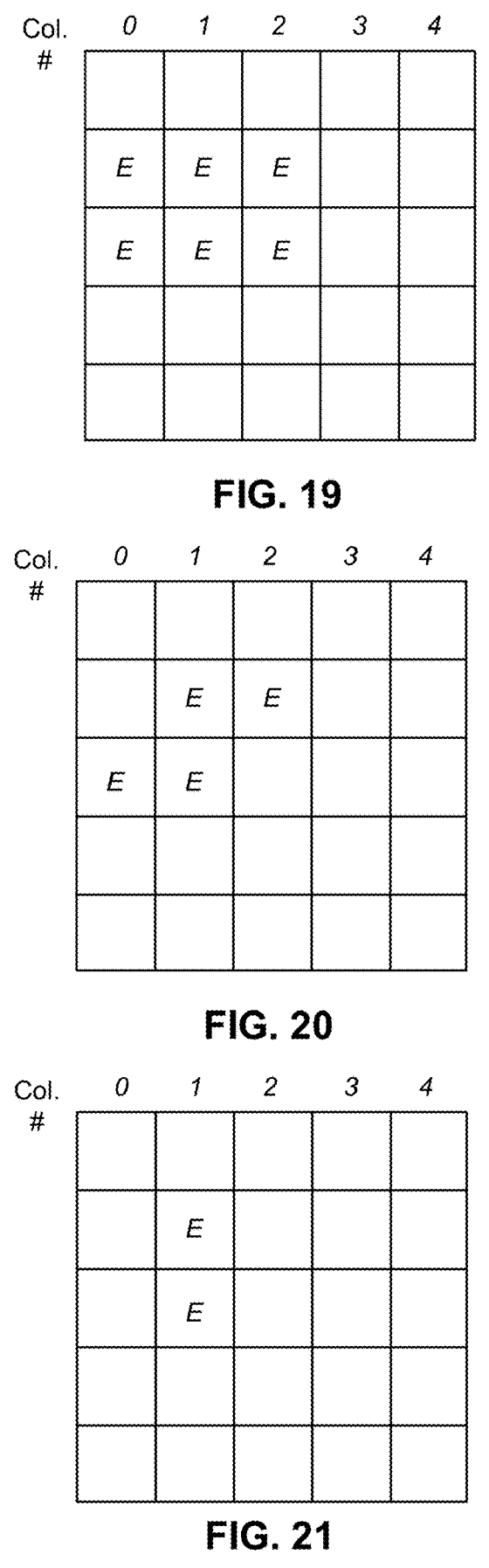

FIG. 19 is an exemplary EBR(5, 2) code where E denotes an erasure. In this example, no row and/or column may be recovered where the rows and/or columns comprise more than one erasure. However, diagonals 1 and 4 comprise one erasure each. The erasures in diagonals 1 and 4 may be recovered.

FIG. 20 is the result of recovering the erasures in diagonals 1 and 4 of FIG. 19. No row with erasures may be recovered where each row comprises more than one erasure. Columns 1 and 2 each comprise exactly one erasure. The erasures in columns 1 and 2 may be recovered.

FIG. 21 is the result of recovering the erasures in columns 1 and 2 of FIG. 19. Rows 1 and 2 each comprise exactly one erasure. The erasures in rows 1 and 2 may be recovered to complete the iterative decoding process.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. The processor may be of any configuration as described herein, such as a discrete processor or a processing circuit that includes many components such as processing hardware, memory, I/O interfaces, etc. By integrated with, what is meant is that the processor has logic embedded therewith as hardware logic, such as an application specific integrated circuit (ASIC), a FPGA, etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer to offer service on demand.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A computer-implemented method, comprising:
encoding an array of (p−1)×k symbols of data into a p×(k+r) array for local recovery of the symbols, wherein the local recovery does not reference other columns, thereby reducing costs for error correction and/or detection,
wherein p is a prime number,
wherein r≥1,
wherein k≤p−r,
wherein each column in the p×(k+r) array has an even parity,
wherein each line of slope j for 0≤j≤r−1 in the p×(k+r) array has an even parity,
wherein the lines of slope j are taken with a toroidal topology modulo p; and
decoding the p×(k+r) array, the decoding comprising:
recovering erasure patterns by iteratively recovering an erased symbol which is in any column and in any line of slope j, 0≤j≤r−1, and
wherein no other symbols in the column and in the line are erased.

2. The computer-implemented method of claim 1, wherein a parity row is appended to the (p−1)×k array to form a p×k array.

3. The computer-implemented method of claim 2, comprising computing r syndrome vectors of length p, wherein symbols of the syndrome vector i for 0≤i≤r−1, are XORs of symbols in each p line of slope i in the p×k array.

4. The computer-implemented method of claim 3, comprising:
applying an iterative procedure over the syndrome vectors in order to obtain r parity columns;
appending the r parity columns to the p×k array; and
outputting the p×(k+r) encoded array.

5. The computer-implemented method of claim 4, wherein r=2.

6. The computer-implemented method of claim 5, comprising:
computing an initial symbol in a first parity column as a function of two syndrome vectors; and
computing remaining parity symbols using a recursive procedure comprising the syndrome vectors and previously computed parity symbols.

7. The computer-implemented method of claim 1, comprising decoding the p×(k+r) array, wherein the decoding comprises:
recovering up to one erased symbol in each column, and recovering up to one erased symbol in each line of slope j, 0≤j≤r−1.

8. The computer-implemented method of claim 1, comprising decoding the p×(k+r) array, the decoding comprising:
recovering up to r erased columns and one erased symbol in the remaining columns.

9. A computer-implemented method, comprising:
encoding an array of (p−1)×k symbols of data into a p×(k+r) array for local recovery of the symbols, wherein the local recovery does not reference other columns, thereby reducing costs for error correction and/or detection,
wherein p is a prime number,
wherein r≥1,
wherein k≤p−r,
wherein each column in the p×(k+r) array has an even parity,
wherein each line of slope j for 0≤j≤r−1 in the p×(k+r) array has an even parity,
wherein the lines of slope j are taken with a toroidal topology modulo p,
wherein a parity row is appended to the (p−1)×k array to form a p×k array;
computing r syndrome vectors of length p, wherein symbols of the syndrome vector i for 0≤i≤r−1, are XORs of symbols in each p line of slope i in the p×k array;
applying an iterative procedure over the syndrome vectors in order to obtain r parity columns;
appending the r parity columns to the p×k array;
outputting the p×(k+r) encoded array;
computing an initial symbol in a first parity column as a function of two syndrome vectors;
computing remaining parity symbols using a recursive procedure comprising the syndrome vectors and previously computed parity symbols;
computing k symbols as the XOR of the first p−u−1 symbols in each data column u for 0≤u≤k−1;
storing such k computed symbols for 0≤u≤k−1;
computing a parity symbol of each data column u by XORing the stored symbol with the last u symbols in such data column u;
computing an initial symbol corresponding to a first parity column by XORing the stored k symbols; and
decoding the p×(k+r) array, the decoding comprising:
recovering erasure patterns by iteratively recovering an erased symbol which is in any column.

10. The computer-implemented method of claim 9, comprising decoding the p×(k+r) array, the decoding comprising:
recovering erasure patterns by iteratively recovering an erased symbol which is in any column and in any line of slope j, 0≤j≤r−1; and
wherein no other symbols in the column and in the line are erased.

11. A computer-implemented method, comprising:
encoding an array of (p−1)×k symbols of data into a p×(k+r) array for local recovery of the symbols, wherein the local recovery does not reference other columns, thereby reducing costs for error correction and/or detection,
wherein p is a prime number,
wherein r≥1,
wherein k≤p−r,
wherein each column in the p×(k+r) array has an even parity, wherein each line of slope j for 0≤j≤r−1 in the p×(k+r) array has an even parity, and
wherein the lines of slope j are taken with a toroidal topology modulo p;
decoding the p×(k+r) array, the decoding comprising: recovering up to r erased columns and one erased symbol in the remaining columns;
obtaining r syndrome vectors of length p for 0≤i≤r−1, wherein the r syndrome vectors comprise an XOR of the symbols over each line of slope i in the p×(k+r) array;
obtaining up to r erased columns using a recursive procedure as a function of the syndrome vectors, wherein the up to r erased columns are initially assumed to be zero;
decoding the p×(k+r) array, the decoding comprising: recovering erasure patterns by iteratively recovering an erased symbol which is in any column; and
outputting the recovered p×(k+r) array.

12. A computer program product for encoding an array of (p−1)×k symbols of data into a p×(k+r) array for local recovery of the symbols, wherein the local recovery does not reference other columns, thereby reducing costs for error correction and/or detection, the computer program product comprising a computer readable storage medium having program instructions embodied therewith, the program instructions executable by a computer to cause the computer to:
encode, by the computer, an array of (p−1)×k symbols of data into a p×(k+r) array,
wherein p is a prime number,
wherein r≥1,
wherein k≤p−r,
wherein each column in the p×(k+r) array has an even parity,
wherein each line of slope j for 0≤j≤r−1 in the p×(k+r) array has an even parity,
wherein the lines of slope j are taken with a toroidal topology modulo p,
wherein a decoding method for the p×(k+r) arrays comprises program instructions executable by the computer cause the computer to:
recover, by the computer, erasure patterns by iteratively recovering an erased symbol which is in any column and in any line of slope j, 0≤j≤r−1, and wherein no other symbols in the column and in the line are erased.

13. The computer program product of claim 12, wherein a parity row is appended to the (p−1)×k array to form a p×k array.

14. The computer program product of claim 13, comprising program instructions executable by the computer to cause the computer to:
compute, by the computer, r syndrome vectors of length p, wherein symbols of the syndrome vector i for 0≤i≤r−1, are XORs of symbols in each p line of slope i in the p×k array.

15. The computer program product of claim 14, comprising program instructions executable by the computer to cause the computer to:
apply, by the computer, an iterative procedure over the syndrome vectors in order to obtain r parity columns;
append, by the computer, the r parity columns to the p×k array; and
output, by the computer, the p×(k+r) encoded array.

16. The computer program product of claim 15, wherein r=2.

17. The computer program product of claim 16, comprising program instructions executable by the computer cause the computer to:
compute, by the computer, an initial symbol in a first parity column as a function of two syndrome vectors; and
compute, by the computer, remaining parity symbols using a recursive procedure comprising the syndrome vectors and previously computed parity symbols.

18. The computer program product of claim 12, comprising program instructions executable by the computer to cause the computer to:
decode the p×(k+r) arrays, wherein the decoding comprises program instructions executable by the computer cause the computer to:
recover, by the computer, up to one erased symbol in each column, and
recover, by the computer, up to one erased symbol in each line of slope j, 0≤j≤r−1.

19. A computer program product for encoding an array of (p−1)×k symbols of data into a p×(k+r) array for local recovery of the symbols, wherein the local recovery does not reference other columns, thereby reducing costs for error correction and/or detection, the computer program product comprising a computer readable storage medium having program instructions embodied therewith, the program instructions executable by a computer to cause the computer to:
encode, by the computer, an array of (p−1)×k symbols of data into a p×(k+r) array, wherein p is a prime number,
wherein r≥1,
wherein k≤p−r,
wherein each column in the p×(k+r) array has an even parity,
wherein each line of slope j for 0≤j≤r−1 in the p×(k+r) array has an even parity,
wherein the lines of slope j are taken with a toroidal topology modulo p,
wherein a parity row is appended to the (p−1)×k array to form a p×k array,
wherein the program instructions executable by the computer cause the computer to:
compute, by the computer, r syndrome vectors of length p, wherein symbols of the syndrome vector i for 0≤i≤r−1, are XORs of symbols in each p line of slope i in the p×k array, wherein the program instructions executable by the computer cause the computer to:
apply, by the computer, an iterative procedure over the syndrome vectors in order to obtain r parity columns;
append, by the computer, the r parity columns to the p×k array; and
output, by the computer, the p×(k+r) encoded array,
wherein r=2;
compute, by the computer, an initial symbol in a first parity column as a function of two syndrome vectors, and
compute, by the computer, remaining parity symbols using a recursive procedure comprising the syndrome vectors and previously computed parity symbols;
compute, by the computer, k symbols as the XORs of the first p−u−1 symbols in each data column u for 0≤u≤k−1;
store, by the computer, such k computed symbols for 0≤u≤k−1;
compute, by the computer, the parity symbol of each data column by XORing the stored symbol with the last u symbols in such data column u;

compute, by the computer, an initial symbol corresponding to the first parity column by XORing the stored k symbols; and decoding the p×(k+r) array, the decoding comprising: recovering erasure patterns by iteratively recovering an erased symbol which is in any column.

20. The computer program product of claim 19, wherein a decoding method for the p×(k+r) arrays comprises program instructions executable by the computer to cause the computer to:

recover, by the computer, erasure patterns by iteratively recovering an erased symbol which is in any column and in any line of slope j, $0 \leq j \leq r-1$; and wherein no other symbols in the column and in the line are erased.

* * * * *